(12) United States Patent
Katsuumi et al.

(10) Patent No.: US 11,050,210 B2
(45) Date of Patent: Jun. 29, 2021

(54) CAPACITOR COOLING STRUCTURE AND LASER APPARATUS

(71) Applicant: Gigaphoton Inc., Tochigi (JP)

(72) Inventors: Hisakazu Katsuumi, Oyama (JP); Junichi Fujimoto, Oyama (JP); Satoshi Tanaka, Oyama (JP)

(73) Assignee: Gigaphoton Inc., Tochigi (JP)

( * ) Notice: Subject to any disclaimer, the term of this patent is extended or adjusted under 35 U.S.C. 154(b) by 23 days.

(21) Appl. No.: 16/730,065

(22) Filed: Dec. 30, 2019

(65) Prior Publication Data
US 2020/0136336 A1 Apr. 30, 2020

Related U.S. Application Data

(63) Continuation of application No. PCT/JP2017/028537, filed on Aug. 7, 2017.

(51) Int. Cl.
*H01S 3/04* (2006.01)
*H01S 3/041* (2006.01)
(Continued)

(52) U.S. Cl.
CPC .......... *H01S 3/041* (2013.01); *H01G 2/08* (2013.01); *H01S 3/032* (2013.01); *H01S 3/034* (2013.01);
(Continued)

(58) Field of Classification Search
CPC ........ H01S 3/041; H01S 3/034; H01S 3/0384; H01S 3/09702; H01S 3/0975; H01S 3/134; H01S 3/032; H01S 3/036; H01S 3/0971
See application file for complete search history.

(56) References Cited

U.S. PATENT DOCUMENTS

| 4,534,032 A | * | 8/1985 | Hoag | .................. H01S 3/036 |
| | | | | 313/231.61 |
| 4,805,072 A | * | 2/1989 | Ackermann | ............ H01G 4/38 |
| | | | | 361/328 |

(Continued)

FOREIGN PATENT DOCUMENTS

| JP | 2000092847 A | 3/2000 |
| JP | 2003249703 A | 9/2003 |

(Continued)

OTHER PUBLICATIONS

International Search Report issued in PCT/JP2017/028537; dated Oct. 31, 2017.
International Preliminary Report on Patentability and Written Opinion issued in PCT/JP2017/028537; dated Feb. 11, 2020.

*Primary Examiner* — Kinam Park
(74) *Attorney, Agent, or Firm* — Studebaker & Brackett PC (57) ABSTRACT

To cool a capacitor including a first electrode and a second electrode, a capacitor cooling structure includes: a conducting part electrically connected with the first electrode; an insulating part that has a first surface including a first position and a second surface including a second position, and is connected with the conducting part at the first position; a first fastening part configured to fasten the conducting part and the insulating part to each other; and a cooling part connected with the second position facing the first position, the conducting part and the cooling part being electrically insulated from each other by the insulating part.

20 Claims, 9 Drawing Sheets

(51) Int. Cl.
*H01G 2/08* (2006.01)
*H01S 3/034* (2006.01)
*H01S 3/038* (2006.01)
*H01S 3/097* (2006.01)
*H01S 3/0975* (2006.01)
*H01S 3/032* (2006.01)
*G03F 7/20* (2006.01)
*H01S 3/134* (2006.01)
*H01S 3/036* (2006.01)
*H01S 3/0971* (2006.01)

(52) U.S. Cl.
CPC .......... *H01S 3/0384* (2013.01); *H01S 3/0975* (2013.01); *H01S 3/09702* (2013.01); *G03F 7/70025* (2013.01); *H01S 3/036* (2013.01); *H01S 3/0971* (2013.01); *H01S 3/134* (2013.01)

(56) References Cited

U.S. PATENT DOCUMENTS

| | | | |
|---|---|---|---|
| 2010/0229942 | A1* | 9/2010 | Luch .................. H01L 31/0392 136/256 |
| 2016/0365696 | A1 | 12/2016 | Tsushima et al. |
| 2018/0195816 | A1 | 7/2018 | Moriyama et al. |

FOREIGN PATENT DOCUMENTS

| | | |
|---|---|---|
| JP | 2004123459 A | 4/2004 |
| JP | 2006210561 A | 8/2006 |
| JP | 2009111313 A | 5/2009 |
| JP | 2009289944 A | 12/2009 |
| JP | 2015133281 A | 7/2015 |
| JP | 2016119440 A | 6/2016 |
| WO | 2015186272 A1 | 12/2015 |
| WO | 2017010322 A1 | 1/2017 |

* cited by examiner

CAPACITOR COOLING STRUCTURE AND LASER APPARATUS

CROSS-REFERENCE TO RELATED APPLICATIONS

The present application is a continuation application of International Application No. PCT/JP2017/028537 filed on Aug. 7, 2017. The content of the application is incorporated herein by reference in its entirety.

BACKGROUND

1. Technical Field

The present disclosure relates to a capacitor cooling structure and a laser apparatus.

2. Related Art

Recently, in a semiconductor exposure apparatus (hereinafter referred to as "exposure apparatus"), resolving power improvement has been requested along with miniaturization and high integration of a semiconductor integrated circuit. Thus, the wavelength of light discharged from an exposure light source has been shortened. Typically, a gas laser apparatus is used as the exposure light source in place of a conventional mercury lamp. Examples of the gas laser apparatus for exposure include a KrF excimer laser apparatus configured to output an ultraviolet laser beam having a wavelength of 248 nm, and an ArF excimer laser apparatus configured to output an ultraviolet laser beam having a wavelength of 193 nm.

LIST OF DOCUMENTS

Patent Documents

Patent Document 1: Japanese Unexamined Patent Application Publication No. 2009-111313
Patent Document 2: Japanese Unexamined Patent Application Publication No. 2015-133281
Patent Document 3: Japanese Unexamined Patent Application Publication No. 2003-249703
Patent Document 4: Japanese Unexamined Patent Application Publication No. 2009-289944

SUMMARY

A capacitor cooling structure according to one aspect of the present disclosure cools a capacitor including a first electrode and a second electrode. The capacitor cooling structure includes: a conducting part electrically connected with the first electrode; an insulating part that has a first surface including a first position and a second surface including a second position, and is connected with the conducting part at the first position; a first fastening part configured to fasten the conducting part and the insulating part to each other; and a cooling part connected with the second position facing the first position. The conducting part and the cooling part are electrically insulated from each other by the insulating part.

A laser apparatus according to another aspect of the present disclosure includes: a laser chamber; a pair of discharge electrodes disposed in the laser chamber; a pulse power module includes a peaking capacitor and configured to apply pulse voltage between the discharge electrodes; a preionization mechanism including a preionization capacitor and configured to ionize part of gas inside the laser chamber, the preionization capacitor including a first electrode and a second electrode; a conducting part electrically connected with the first electrode; an insulating part that has a first surface including a first position and a second surface including a second position, and is connected with the conducting part at the first position; a first fastening part configured to fasten the conducting part and the insulating part to each other; and a cooling part connected with the second position facing the first position. The conducting part and the cooling part are electrically insulated from each other by the insulating part.

BRIEF DESCRIPTION OF THE DRAWINGS

Embodiments of the present disclosure will be described below as examples with reference to the accompanying drawings.

DESCRIPTION OF EMBODIMENTS

<Contents>
1. Comparative example
 1.1 Configuration of laser apparatus
 1.2 Operation of laser apparatus
 1.3 Details of pulse power module and preionization mechanism
  1.3.1 Configuration
  1.3.2 Operation
 1.4 Problem
2. Cooling structure in which conducting part and insulating part are fastened to each other
 2.1 Configuration
 2.2 Operation and effect
3. Cooling structure provided to preionization wire
 3.1 Configuration
 3.2 Operation and effect
4. Other
 4.1 Configuration of reference example
 4.2 Operation and effect of reference example
 4.3 Supplement Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Comparative Example

1.1 Configuration of Laser Apparatus

Figure 1:
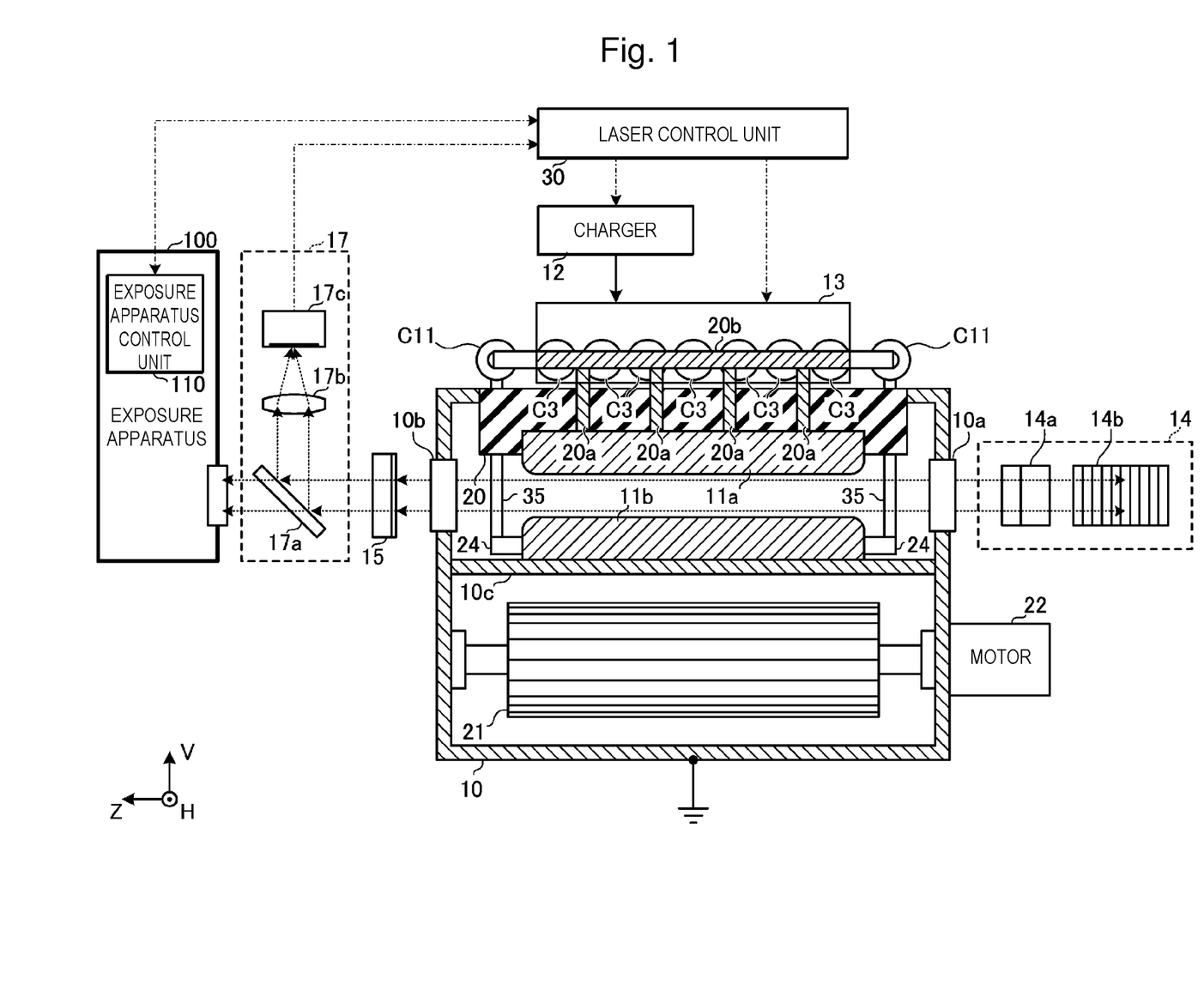
FIG. 1 schematically illustrates the configuration of a laser apparatus according to a comparative example.
Figure 2:
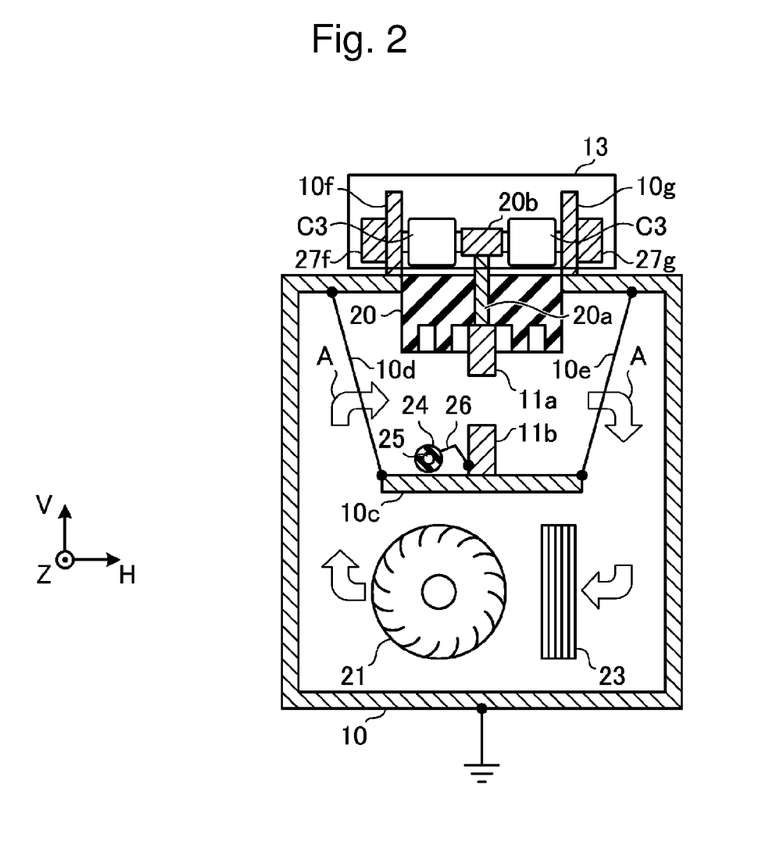
FIG. 2 schematically illustrates the configuration of the laser apparatus according to the comparative example.

FIGS. 1 and 2 schematically illustrate the configuration of a laser apparatus according to a comparative example. FIG. 1 illustrates the internal configuration of the laser apparatus when viewed in a direction substantially orthogonal to a discharge direction between a pair of discharge electrodes 11a and 11b and substantially orthogonal to the traveling direction of a laser beam output from an output coupling mirror 15. FIG. 2 illustrates the internal configuration of the laser apparatus when viewed in a direction substantially parallel to the traveling direction of the laser beam output from the output coupling mirror 15. The traveling direction of the laser beam output from the output coupling mirror 15 is defined as a Z direction. The discharge direction between the discharge electrodes 11a and 11b is defined as a V direction. A direction orthogonal to both of these directions is defined as a H direction. A negative V direction is substantially aligned with the direction of gravitational force.

As illustrated in FIG. 1, the laser apparatus is used together with an exposure apparatus 100. A laser beam output from the laser apparatus is incident on the exposure apparatus 100. The exposure apparatus 100 includes an exposure apparatus control unit 110. The exposure apparatus control unit 110 controls the exposure apparatus 100. The exposure apparatus control unit 110 transmits target-pulse-energy setting data to a laser control unit 30 included in the laser apparatus, and transmits a light emission trigger signal.

The laser apparatus includes a laser chamber 10, a charger 12, a pulse power module 13, a line narrowing module 14, the output coupling mirror 15, an energy monitor 17, a cross-flow fan 21, a motor 22, and the laser control unit 30. The laser control unit 30 collectively controls the entire laser apparatus.

The laser chamber 10 is disposed on the optical path of a laser resonator configured by the line narrowing module 14 and the output coupling mirror 15. The laser chamber 10 is provided with two windows 10a and 10b. The laser chamber 10 houses the discharge electrodes 11a and 11b. The laser chamber 10 houses laser gas as a laser medium.

The laser chamber 10 has an opening blocked by an electrically insulating part 20. The electrically insulating part 20 supports a discharge electrode 11a. A plurality of conducting parts 20a are embedded in the electrically insulating part 20. The conducting parts 20a are each electrically connected with the discharge electrode 11a.

A return plate 10c is disposed inside the laser chamber 10. The laser chamber 10 and the return plate 10c are electrically connected with each other through a wiring portion 10d and a wiring portion 10e illustrated in FIG. 2. The return plate 10c supports a discharge electrode 11b. The return plate 10c is electrically connected with the discharge electrode 11b.

The return plate 10c does not completely divide the inside of the laser chamber 10. As illustrated in FIG. 2, the return plate 10c has gaps through which the laser gas passes on the front and back sides of the sheet of FIG. 1.

The cross-flow fan 21 is disposed inside the laser chamber 10. The rotational axis of the cross-flow fan 21 is connected with the motor 22 disposed outside the laser chamber 10. The motor 22 rotates the cross-flow fan 21. Accordingly, the laser gas circulates inside the laser chamber 10 as illustrated with arrow A in FIG. 2. A heat exchanger 23 discharges the thermal energy of the laser gas having obtained a high temperature by electrical discharging to the outside of the laser chamber 10.

The charger 12 holds electric energy to be supplied to the pulse power module 13.

The pulse power module 13 includes a plurality of peaking capacitors C3. The pulse power module 13 corresponds to a power source device in the present disclosure. Each peaking capacitor C3 includes two electrodes. One of the two electrodes is electrically connected with a connection plate 20b, and the other electrode is electrically connected with a connection plate 10f or 10g illustrated in FIG. 2. The connection plate 20b is electrically connected with the discharge electrode 11a through the conducting parts 20a. The connection plates 10f and 10g are electrically connected with the discharge electrode 11b through the laser chamber 10, the wiring portions 10d and 10e, and the return plate 10c. The laser chamber 10 is electrically connected with a reference potential. The reference potential is a reference for pulse high voltage generated by the pulse power module 13 and is, for example, ground potential.

A cooling mechanism 27f is fixed in contact with the connection plate 10f, and a cooling mechanism 27g is fixed in contact with the connection plate 10g. The cooling mechanisms 27f and 27g each include a cooling pipe (not illustrated) through which a cooling medium such as water passes. The cooling mechanisms 27f and 27g are each made of metal having high thermal conductivity. The cooling mechanisms 27f and 27g have a potential equal to that of the connection plates 10f and 10g.

The laser apparatus also includes a preionization mechanism. The preionization mechanism includes a preionization capacitor C11, a preionization wire 35, and a dielectric pipe 24, which are illustrated in FIG. 1, and a preionization inner electrode 25 and a plurality of preionization outer electrodes 26, which are illustrated in FIG. 2. Each preionization capacitor C11 includes two electrodes. One of the two electrodes is electrically connected with the connection plate 20b, and the other electrode is electrically connected with the preionization inner electrode 25 through the preionization wire 35. The preionization inner electrode 25 corresponds to a third electrode in the present disclosure. The preionization wire 35 is covered by an insulator (not illustrated). The preionization inner electrode 25 is covered by the dielectric pipe 24.

Each preionization outer electrode 26 has one end electrically connected with the discharge electrode 11b, and the other end contacting the surface of the dielectric pipe 24. The preionization inner electrode 25 and the preionization outer electrodes 26 are disposed in the longitudinal direction of the discharge electrode 11b at positions upstream of the position of the discharge electrode 11b in the circulation direction of the laser gas.

The line narrowing module 14 includes wavelength selection elements such as a prism 14a and a grating 14b. A high reflectance mirror may be used in place of the line narrowing module 14.

The output coupling mirror 15 is configured by a partially reflective mirror.

The energy monitor 17 includes a beam splitter 17a, a light condensation lens 17b, and an optical sensor 17c. The beam splitter 17a is disposed on the optical path of a laser beam output from the output coupling mirror 15. The beam splitter 17a transmits part of the laser beam output from the output coupling mirror 15 toward the exposure apparatus 100 at high transmittance, and reflects the other part. The light condensation lens 17b and the optical sensor 17c are disposed on the optical path of the laser beam reflected by the beam splitter 17a.

1.2 Operation of Laser Apparatus

The laser control unit 30 receives the target-pulse-energy setting data and the light emission trigger signal from the exposure apparatus control unit 110. The laser control unit 30 transmits setting data of charge voltage to the charger 12 based on the target-pulse-energy setting data received from the exposure apparatus control unit 110. In addition, the laser control unit 30 transmits a trigger signal to the pulse power module 13 based on the light emission trigger signal received from the exposure apparatus control unit 110.

Having received the trigger signal from the laser control unit 30, the pulse power module 13 generates pulse high voltage from electric energy charged at the charger 12, and applies the high voltage between the discharge electrodes 11a and 11b.

When the high voltage is applied between the discharge electrodes 11a and 11b, electrical discharging occurs between the discharge electrodes 11a and 11b. The electrical discharging is referred to as main electrical discharging. The laser gas in the laser chamber 10 is excited by the energy of the main electrical discharging and transitions to a higher energy level. Thereafter, when transitioning to a lower energy level, the excited laser gas discharges light having a wavelength in accordance with the difference between the energy levels.

The light generated in the laser chamber 10 is emitted out of the laser chamber 10 through the windows 10a and 10b. The beam width of the light emitted through the window 10a of the laser chamber 10 is expanded by the prism 14a, and then the light is incident on the grating 14b. The light incident on the grating 14b from the prism 14a is reflected by a plurality of grooves of the grating 14b and diffracted into a direction in accordance with the wavelength of the light. The grating 14b is disposed in a Littrow configuration so that the incident angle of the light incident on the grating 14b from the prism 14a is equal to the diffracting angle of diffracted light having a desired wavelength. Accordingly, the light near the desired wavelength is returned to the laser chamber 10 through the prism 14a.

The output coupling mirror 15 transmits and outputs part of the light emitted through the window 10b of the laser chamber 10, and reflects and returns the other part to the laser chamber 10.

In this manner, light emitted from the laser chamber 10 is reciprocated between the line narrowing module 14 and the output coupling mirror 15. The light is amplified each time the light passes through an electrical discharging space between the discharge electrodes 11a and 11b. In addition, the spectral width of the light is narrowed each time the light is returned by the line narrowing module 14. Accordingly, the light obtained through the laser oscillation and the line narrowing is output as a laser beam from the output coupling mirror 15.

The light condensation lens 17b included in the energy monitor 17 focuses, to the optical sensor 17c, a laser beam reflected by the beam splitter 17a. The optical sensor 17c transmits, as measurement data to the laser control unit 30, an electric signal in accordance with the pulse energy of the laser beam focused by the light condensation lens 17b.

The laser control unit 30 receives the measurement data from the energy monitor 17. The laser control unit 30 performs feedback control of charge voltage set to the charger 12 based on the pulse energy measurement data received from the energy monitor 17 and the target-pulse-energy setting data received from the exposure apparatus control unit 110.

Figure 3:
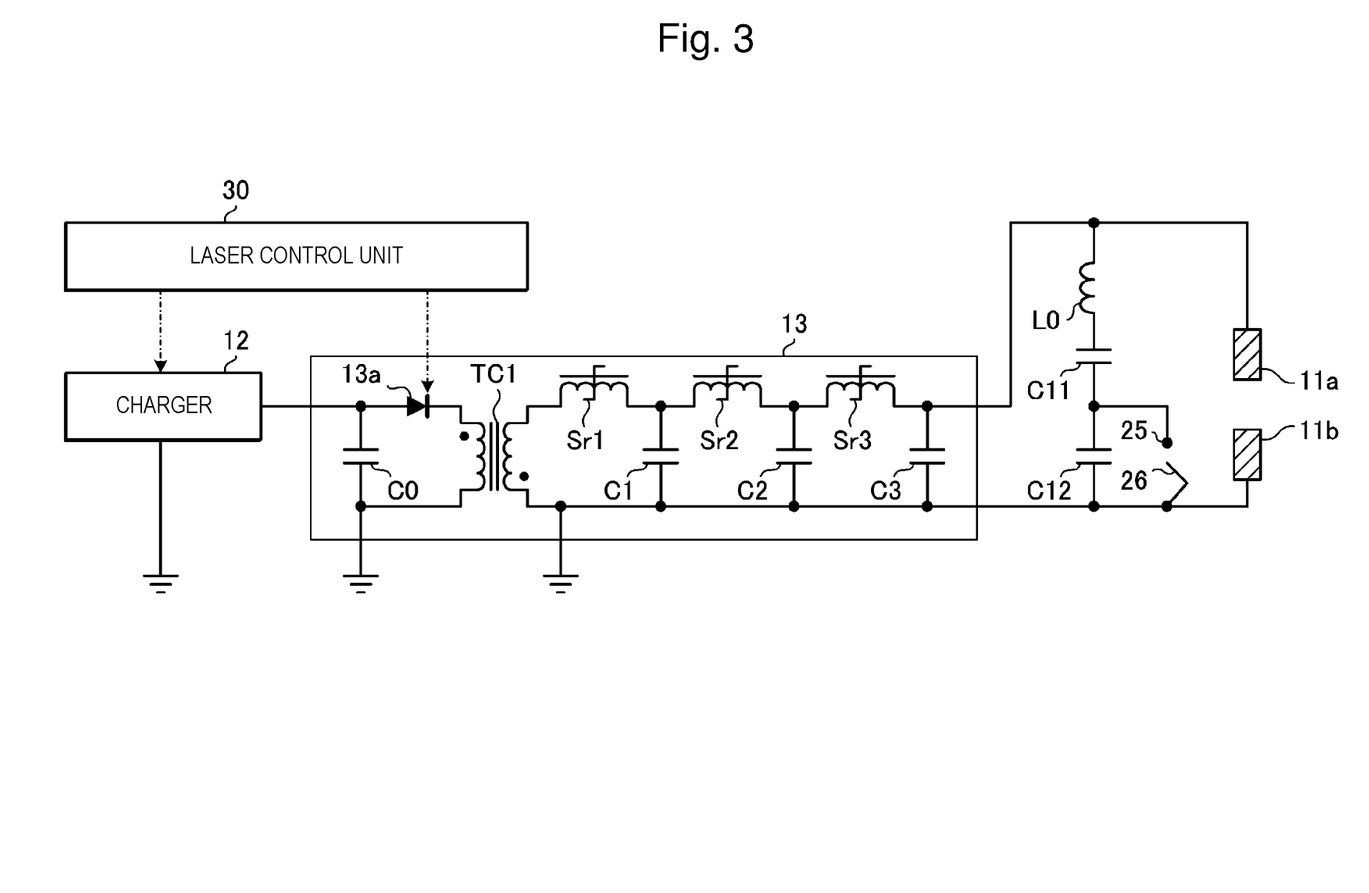
FIG. 3 is a circuit diagram of a pulse power module and a preionization mechanism.

1.3 Details of Pulse Power Module and Preionization Mechanism 1.3.1 Configuration FIG. 3 is a circuit diagram of the pulse power module and the preionization mechanism. The pulse power module 13 includes a charging capacitor C0, a switch 13a, a step-up transformer TC1, a plurality of magnetic switches Sr1 to Sr3, capacitors C1 and C2, and a peaking capacitor C3.

The magnetic switches Sr1 to Sr3 each include a saturable reactor. The impedance of each of the magnetic switches Sr1 to Sr3 becomes low when the time integral value of voltage applied to both ends thereof becomes equal to a predetermined value determined by characteristics of the magnetic switch.

The preionization capacitor C11 and an inductor L0 are electrically connected between one electrode of the peaking capacitor C3 electrically connected with the discharge electrode 11a and the preionization inner electrode 25. The preionization wire 35 is configured as the inductor L0.

A capacitor C12 is electrically connected between the preionization inner electrode 25 and each preionization outer electrode 26 electrically connected with the discharge electrode 11b. The dielectric pipe 24 is configured as the capacitor C12.

The pulse high voltage supplied from the pulse power module 13 is divided to the preionization capacitor C11 and the capacitor C12. For example, a capacitance ratio between the preionization capacitor C11 and the capacitor C12 is set so that voltage applied to the capacitor C12 is in the range of 25% to 75% inclusive of the voltage supplied from the pulse power module 13.

The timing of voltage application between the preionization outer electrode 26 and the preionization inner electrode 25 is adjusted by selecting the capacitance of the preionization capacitor C11, the capacitance of the capacitor C12, and the inductance of the inductor L0. Combined capacitance of the preionization capacitor C11 and the capacitor C12 may be 10% of the capacitance of the peaking capacitor C3 or lower.

1.3.2 Operation

The charger 12 charges the charging capacitor C0 based on the charge voltage set by the laser control unit 30.

The trigger signal is input to the switch 13a of the pulse power module 13 by the laser control unit 30. When the trigger signal is input to the switch 13a, the switch 13a is turned on. When the switch 13a is turned on, current flows from the charging capacitor C0 to the primary side of the step-up transformer TC1.

When current flows to the primary side of the step-up transformer TC1, current in the opposite direction flows to the secondary side of the step-up transformer TC1 by electromagnetic induction. When current flows to the secondary side of the step-up transformer TC1, the time integral value of voltage applied to the magnetic switch Sr1 eventually reaches a threshold.

When the time integral value of voltage applied to the magnetic switch Sr1 has reached the threshold, the magnetic switch Sr1 is magnetically saturated and closed.

When the magnetic switch Sr1 is closed, current flows from the secondary side of the step-up transformer TC1 to the capacitor C1, and accordingly, the capacitor C1 is charged.

As the capacitor C1 is charged, the magnetic switch Sr2 is eventually magnetically saturated and closed.

When the magnetic switch Sr2 is closed, current flows from the capacitor C1 to the capacitor C2, and accordingly, the capacitor C2 is charged. In this case, the capacitor C2 is charged in a pulse width shorter than the pulse width of current when the capacitor C1 is charged.

As the capacitor C2 is charged, the magnetic switch Sr3 is eventually magnetically saturated and closed.

When the magnetic switch Sr3 is closed, current flows from the capacitor C2 to the peaking capacitor C3, and accordingly, the peaking capacitor C3 is charged. In this case, the peaking capacitor C3 is charged in a pulse width shorter than the pulse width of current when the capacitor C2 is charged.

In this manner, as current sequentially flows from the capacitor C1 to the capacitor C2 and from the capacitor C2 to the peaking capacitor C3, the pulse width of the current is compressed to obtain high voltage.

When the voltage of the peaking capacitor C3 has reached the breakdown voltage of the laser gas, the main electrical discharging occurs between the discharge electrodes 11a and 11b. Accordingly, the laser gas is excited to perform laser oscillation. As the main electrical discharging is repeated through switching operation of the switch 13a, a pulse laser beam is output at a predetermined repetition frequency.

Electric field is generated around the dielectric pipe 24 by voltage applied between each preionization outer electrode 26 and the preionization inner electrode 25. The electric field causes corona discharging around the dielectric pipe 24. Short-wavelength light is generated by the corona discharging. The short-wavelength light ionizes part of the laser gas between the discharge electrodes 11a and 11b, and generates charged particles. The ionization of part of the laser gas before the main electrical discharging is referred to as preionization. The capacitance of the preionization capacitor C11, the capacitance of the capacitor C12, and the inductance of the inductor L0 are selected to cause the main electrical discharging at a predetermined timing after the preionization. Accordingly, the main electrical discharging can be caused with less imbalance in the longitudinal direction of the discharge electrodes 11a and 11b, which enables stable outputting of a laser beam.

1.4 Problem

An electric loss occurs at the peaking capacitor C3 and changes into heat. When the temperature of the peaking capacitor C3 is changed by the heat, the capacitance of the peaking capacitor C3 is changed. Accordingly, the timing of the main electrical discharging is shifted and the laser outputting stability is degraded in some cases. To avoid this, the peaking capacitor C3 is cooled by the cooling mechanism 27f connected through the connection plate 10f or by the cooling mechanism 27g connected through the connection plate 10g.

In addition, heat is generated at the preionization capacitor C11, and the capacitance of the preionization capacitor C11 is changed. Accordingly, the timing of the preionization is shifted and the laser outputting stability is degraded in some cases. However, the preionization capacitor C11 has a potential different from the potential of the cooling mechanisms 27f and 27g, and is difficult to be cooled by the cooling mechanisms 27f and 27g in some cases. Air flow can be generated by a cooling fan (not illustrated) to cool the preionization capacitor C11, but the effect of cooling by air flow is insufficient in some cases.

Japanese Unexamined Patent Application Publication No. 2009-111313 discloses, in FIG. 4, a structure in which a preionization conducting member electrically connected with a preionization capacitor contacts a ceramic member having high thermal conductivity, and the ceramic member contacts a water cooling jacket as a cooling member. However, with this structure, contact force between the preionization conducting member and the ceramic member potentially varies between products. When the contact force between the preionization conducting member and the ceramic member is weak, heat conduction from the preionization conducting member to the ceramic member is insufficient so that the preionization capacitor cannot be sufficiently cooled in some cases.

In embodiments described below, a conducting part electrically connected with a preionization capacitor, and an insulating part connected with a cooling part are fastened to each other by a first fastening part to achieve cooling of the preionization capacitor.

Figure 4A:
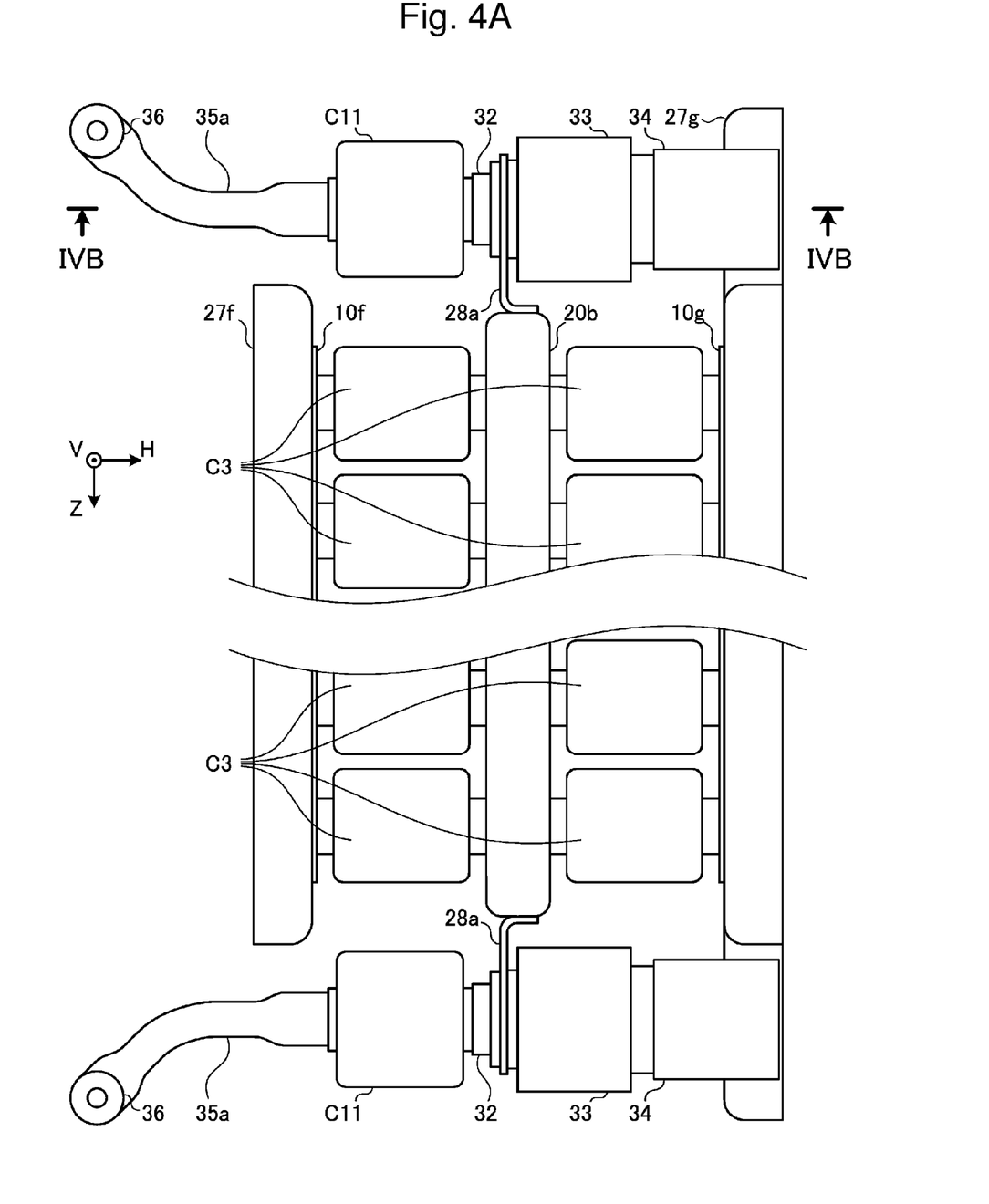
FIG. 4A is a plan view illustrating disposition of peaking capacitors and preionization capacitors in a laser apparatus according to a first embodiment.
Figure 4B:
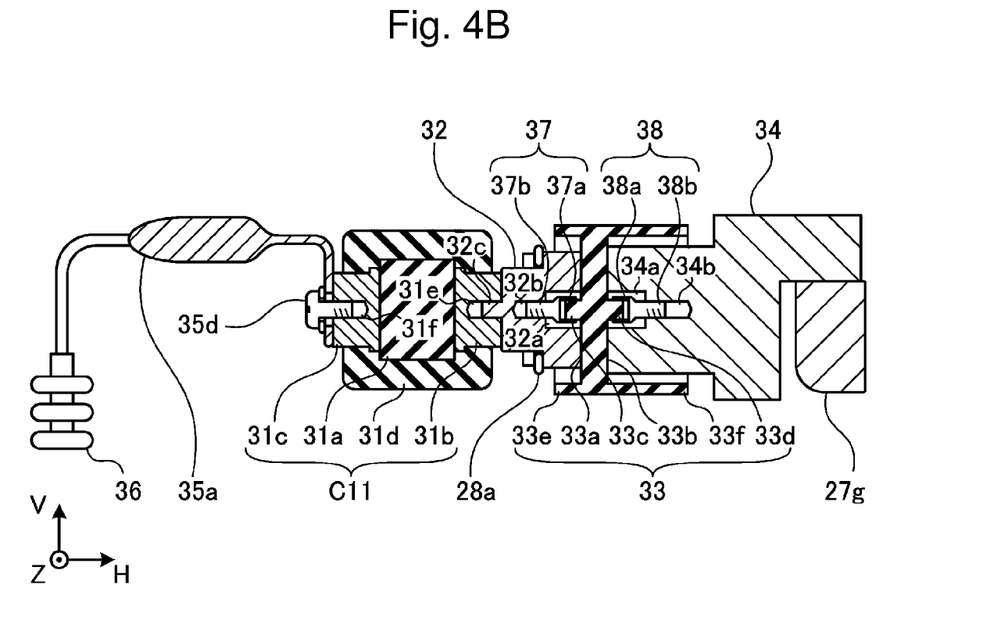
FIG. 4B is a cross-sectional view taken along line IVB-IVB in FIG. 4A.

2. Cooling Structure in which Conducting Part and Insulating Part are Fastened to Each Other 2.1 Configuration FIG. 4A is a plan view illustrating disposition of peaking capacitors and preionization capacitors in a laser apparatus according to a first embodiment. FIG. 4B is a cross-sectional view taken along line IVB-IVB in FIG. 4A.

The connection plate 20b is disposed on the electrically insulating part 20 illustrated in FIGS. 1 and 2. The connection plate 20b is disposed so that the longitudinal direction of the discharge electrodes 11a and 11b and the longitudinal direction of the connection plate 20b are substantially parallel to each other. The connection plate 20b is electrically connected with an output terminal for the pulse high voltage output from the pulse power module 13. A plurality of peaking capacitors C3 are disposed side by side on each of the H direction side and the negative H direction side of the connection plate 20b.

The connection plates 10f and 10g are disposed substantially in parallel to the connection plate 20b with the connection plate 20b interposed therebetween. The connection plates 10f and 10g are electrically connected with the reference potential. The cooling mechanism 27f is fixed in contact with the connection plate 10f, and the cooling mechanism 27g is fixed in contact with the connection plate 10g.

As illustrated in FIG. 4B, each preionization capacitor C11 includes a capacitor body 31a, a first electrode 31b, a second electrode 31c, and a covering part 31d. The capacitor body 31a is sandwiched between the first electrode 31b and the second electrode 31c, and achieves predetermined capacitance between the first electrode 31b and the second electrode 31c. The covering part 31d covers the capacitor body 31a, part of the first electrode 31b, and part of the second electrode 31c.

The second electrode 31c is electrically connected with a preionization wire 35a. To fix the preionization wire 35a to the second electrode 31c, a bolt 35d penetrating through the preionization wire 35a is screwed into a bolt hole 31f formed at the second electrode 31c.

The preionization wire 35a is introduced into the laser chamber 10 through a feed through 36. The preionization wire 35a is electrically connected with the preionization inner electrode 25 inside the laser chamber 10. Accordingly, the second electrode 31c is electrically connected with the preionization inner electrode 25. The preionization inner electrode 25 has a potential between the potential of the pulse high voltage output from the pulse power module 13 and the reference potential.

The first electrode 31b is connected with a cooling structure including a conducting part 32, an insulating part 33, and a cooling part 34.

The conducting part 32 has a first bolt hole including a first large-diameter part 32a and a first small-diameter part 32b at which a female screw is formed, and a male screw part 32c. The first bolt hole and the male screw part 32c are positioned on surfaces of the conducting part 32 opposite to each other. When the male screw part 32c is screwed into a bolt hole 31e of the first electrode 31b, the conducting part 32 and the first electrode 31b are electrically connected with each other. The conducting part 32 is made of a material such as copper having high electric conductivity.

One end of a conducting member 28a is fixed in contact with the conducting part 32. The other end of the conducting member 28a is fixed in contact with the connection plate 20b. Accordingly, the first electrode 31b of the preionization capacitor C11 is electrically connected with the output terminal for the pulse high voltage output from the pulse power module 13, through the conducting part 32, the conducting member 28a, and the connection plate 20b.

The insulating part 33 has a first surface including a first position 33a, and a second surface including a second position 33b. The first surface and the second surface are opposite to each other. The first position 33a and the second position 33b face to each other. The insulating part 33 further includes a first protrusion part 33c protruding substantially in the normal direction of the first surface substantially from the center of the first position 33a, and a second protrusion part 33d protruding substantially in the normal direction of the second surface substantially from the center of the second position 33b. The insulating part 33 further includes a first cover 33e protruding substantially in the normal direction of the first surface around the first position 33a, and a second cover 33f protruding substantially in the normal direction of the second surface around the second position 33b.

The insulating part 33 is preferably made of a material having low relative permittivity. The relative permittivity of the insulating part 33 is preferably 10 or lower. For example, the insulating part 33 is made of aluminum oxide having a relative permittivity of 8.4 to 9.9 inclusive, or aluminum nitride having relative permittivity of 8.5 to 8.6 inclusive.

A first fastening part 37 is fixed to the first protrusion part 33c of the insulating part 33. The first fastening part 37 includes a first part 37a fixed to the first protrusion part 33c, and a second part 37b at which a male screw to be screwed into the first small-diameter part 32b of the first bolt hole is formed. The first part 37a is covered around the first protrusion part 33c and brazed to the first protrusion part 33c, and accordingly, is solidly fixed to the first protrusion part 33c. In addition, the second part 37b is screwed into the first small-diameter part 32b so that the conducting part 32 and the insulating part 33 are fastened to each other.

In this case, the conducting part 32 is fixed in close contact with the first position 33a of the insulating part 33. The first cover 33e surrounds the conducting part 32, covering one end of the conducting part 32. The first part 37a is housed in the first large-diameter part 32a, and the second part 37b is housed in the first small-diameter part 32b.

When the insulating part 33 is made of ceramic containing aluminum oxide, the first fastening part 37 preferably contains an alloy containing nickel and cobalt. Accordingly, the insulating part 33 and the first fastening part 37 are made of materials having thermal expansion rates close to each other, thereby preventing the fixation between the insulating part 33 and the first fastening part 37 by brazing from being affected by temperature change.

For sufficiently close contact between the conducting part 32 and the insulating part 33, a contact surface of the conducting part 32 and the insulating part 33 preferably has a surface roughness Ra of 6.3 µm or smaller. For example, the surface roughness Ra is preferably 3.2 µm. In addition, the contact surface of the conducting part 32 and the insulating part 33 preferably has area of 110 mm$^2$ or larger. For example, the area is preferably 150 mm$^2$.

The conducting part 32 and the first position 33a of the insulating part 33 may contact each other through a metal sheet. The metal sheet may be made of, for example, aluminum, copper, or tin. The thickness of the metal sheet may be 10 µm to 30 µm inclusive. The thickness may be more preferably 10 µm to 20 µm inclusive.

Alternatively, the conducting part 32 and the first position 33a of the insulating part 33 may contact each other through a resin sheet. The resin sheet may be made of, for example, silicone rubber or acrylic rubber. The thickness of the resin sheet may be 10 µm to 1000 µm inclusive. For example, the thickness may be 500 µm.

When the metal sheet or the resin sheet is used, a space layer between the conducting part 32 and the insulating part 33 is reduced so that heat conduction from the conducting part 32 to the insulating part 33 is efficiently performed.

The cooling part 34 has a second bolt hole including a second large-diameter part 34a and a second small-diameter part 34b at which a female screw is formed. The cooling part 34 is made of a material such as copper having high electric conductivity.

The cooling part 34 is connected with the cooling mechanism 27g at a part different from the second bolt hole. Accordingly, heat conduction from the cooling part 34 to the cooling mechanism 27g is possible. In addition, the cooling part 34 is electrically connected with the reference potential through the cooling mechanism 27g and the connection plate 10g.

A second fastening part 38 is fixed to the second protrusion part 33d of the insulating part 33. The second fastening part 38 includes a third part 38a fixed to the second protrusion part 33d, and a fourth part 38b at which a male screw to be screwed into the second small-diameter part 34b of the second bolt hole is formed. The third part 38a is covered around the second protrusion part 33d and brazed to the second protrusion part 33d, and accordingly, is solidly fixed to the second protrusion part 33d. In addition, the fourth part 38b is screwed into the second small-diameter part 34b so that the cooling part 34 and the insulating part 33 are fastened to each other.

In this case, the cooling part 34 is fixed in close contact with the second position 33b of the insulating part 33. The second cover 33f surrounds the cooling part 34, covering one end of the cooling part 34. The third part 38a is housed in the second large-diameter part 34a, and the fourth part 38b is housed in the second small-diameter part 34b.

When the insulating part 33 is made of ceramic containing aluminum oxide, the second fastening part 38 preferably contains an alloy containing nickel and cobalt. Accordingly, the insulating part 33 and the second fastening part 38 are made of materials having thermal expansion rates close to each other, thereby preventing the fixation between the insulating part 33 and the second fastening part 38 by brazing from being affected by temperature change.

For sufficiently close contact between the cooling part 34 and the insulating part 33, a contact surface of the cooling part 34 and the insulating part 33 preferably has a surface roughness Ra of 6.3 µm or smaller. For example, the surface roughness Ra is preferably 3.2 µm. In addition, the contact surface of the cooling part 34 and the insulating part 33 preferably has area of 110 mm$^2$ or larger. For example, the area is preferably 150 mm$^2$.

The cooling part 34 and the second position 33b of the insulating part 33 may contact each other through a metal sheet. The metal sheet may be made of, for example, aluminum, copper, or tin. The thickness of the metal sheet may be 10 µm to 30 µm inclusive. The thickness may be more preferably 10 µm to 20 µm inclusive.

Alternatively, the cooling part 34 and the second position 33b of the insulating part 33 may contact each other through a resin sheet. The resin sheet may be made of, for example, silicone rubber or acrylic rubber. The thickness of the resin sheet may be 10 µm to 1000 µm inclusive. For example, the thickness may be 500 µm.

When the metal sheet or the resin sheet is used, a space layer between the cooling part 34 and the insulating part 33 is reduced so that heat conduction from the insulating part 33 to the cooling part 34 is efficiently performed.

2.2 Operation and Effect

Heat generated at the preionization capacitor C11 is discharged to the cooling part 34 by heat conduction through the conducting part 32 and the insulating part 33. Since the conducting part 32 is fixed in close contact with the first position 33a of the insulating part 33 by the first fastening part 37, heat conduction from the conducting part 32 to the insulating part 33 is efficiently performed. Since the cooling part 34 is fixed in close contact with the second position 33b of the insulating part 33 by the second fastening part 38, heat conduction from the insulating part 33 to the cooling part 34 is efficiently performed.

The first position 33a and the second position 33b are positioned facing to each other. With this configuration, heat discharge from the conducting part 32 to the cooling part 34 is efficiently performed when the thermal conductivity of the insulating part 33 is lower than the thermal conductivity of the conducting part 32 or the cooling part 34.

The conducting part 32 is electrically connected with the potential of the pulse high voltage output from the pulse power module 13, and the cooling part 34 is electrically connected with the reference potential. However, the conducting part 32 is electrically insulated from the cooling part 34 by the insulating part 33. With this configuration, the conducting part 32 can be cooled by using the cooling part 34 when the potential of the conducting part 32 and the potential of the cooling part 34 are different from each other.

The first cover 33e of the insulating part 33 covers one end of the conducting part 32, and the second cover 33f of the insulating part 33 covers one end of the cooling part 34. Accordingly, electrical discharging between the conducting part 32 and the cooling part 34 can be prevented.

The insulating part 33 is made of a material having low relative permittivity. Accordingly, the capacitance of the insulating part 33 is reduced so that the insulating part 33 can be prevented from functioning as a capacitor.

Other features are same as those of the comparative example described with reference to FIGS. 1 to 3.

3. Cooling Structure Provided to Preionization Wire 3.1 Configuration

Figure 5A:
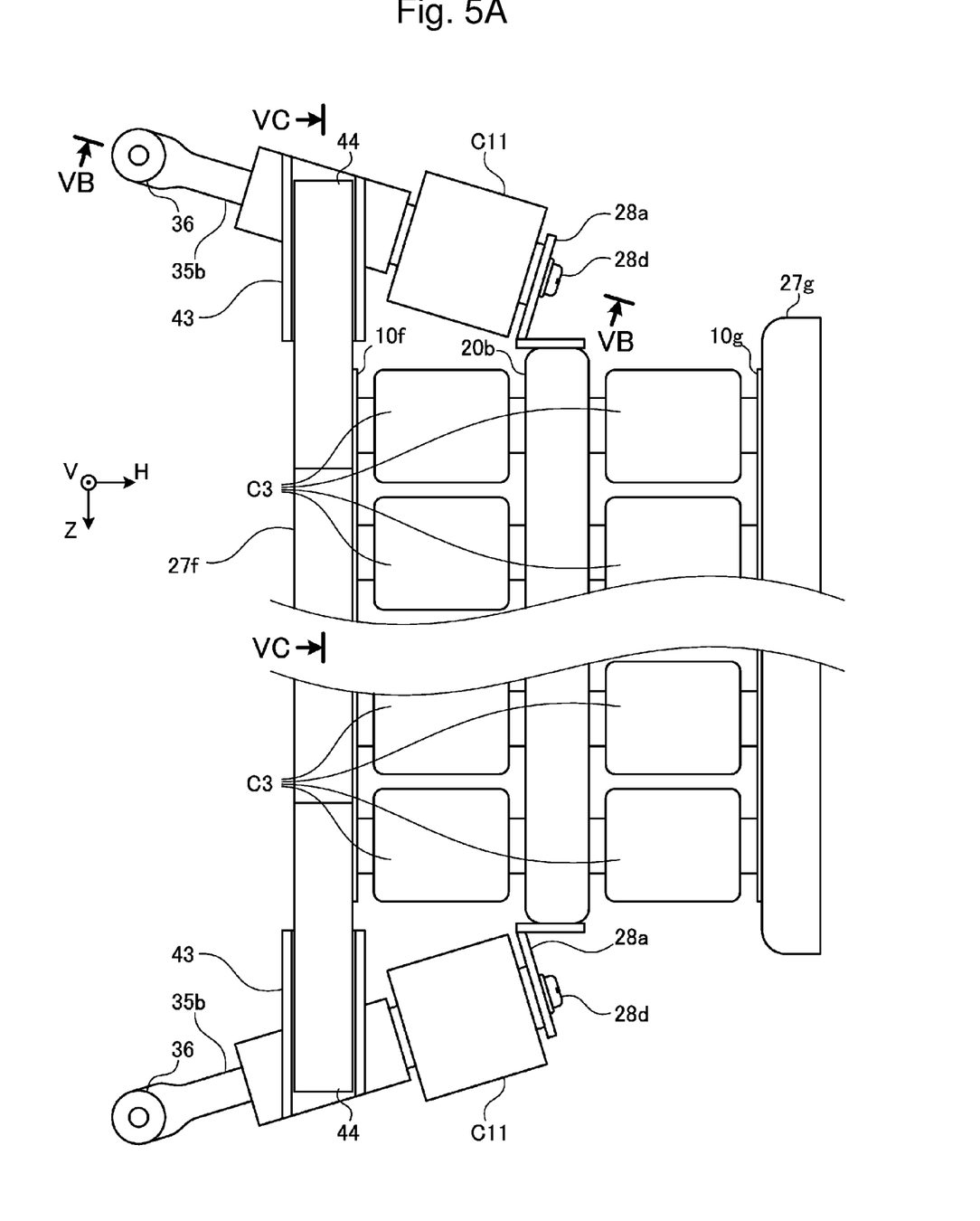
FIG. 5A is a plan view illustrating disposition of peaking capacitors and preionization capacitors in a laser apparatus according to a second embodiment.
Figure 5B:
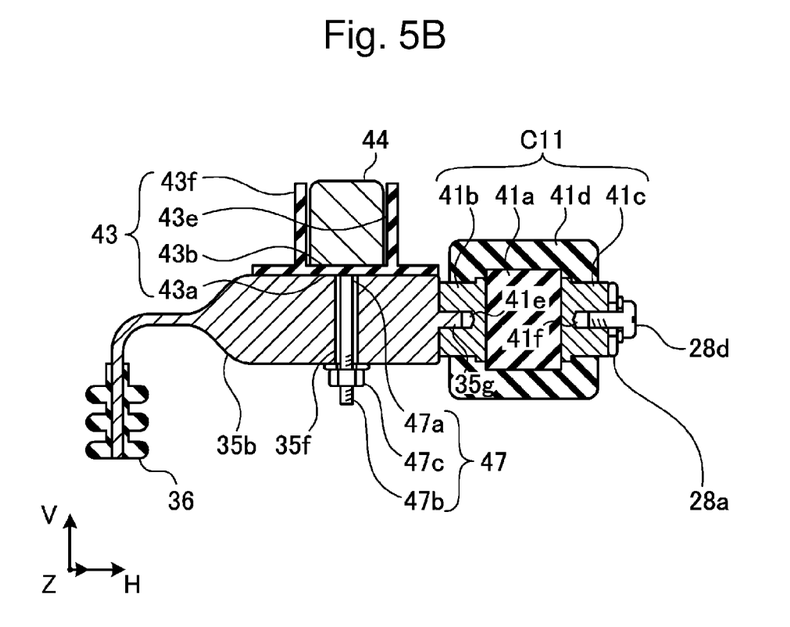
FIG. 5B is a cross-sectional view taken along line VB-VB in FIG. 5A.
Figure 5C:
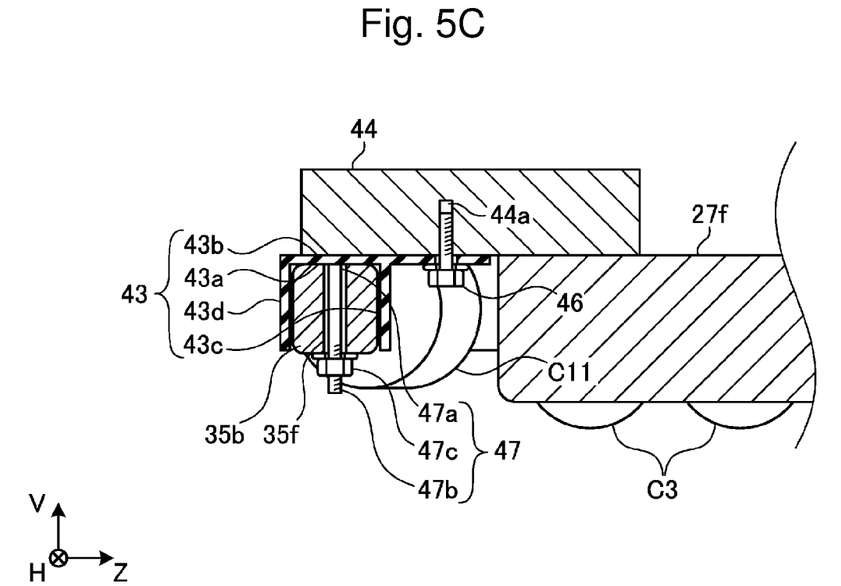
FIG. 5C is a cross-sectional view taken along line VC-VC in FIG. 5A.

FIG. 5A is a plan view illustrating disposition of peaking capacitors and preionization capacitors in a laser apparatus according to a second embodiment. FIG. 5B is a cross-sectional view taken along line VB-VB in FIG. 5A. FIG. 5C is a cross-sectional view taken along line VC-VC in FIG. 5A.

As illustrated in FIG. 5B, each preionization capacitor C11 includes a capacitor body 41a, a first electrode 41b, a second electrode 41c, and a covering part 41d. The capacitor body 41a is sandwiched between the first electrode 41b and the second electrode 41c, and achieves predetermined capacitance between the first electrode 41b and the second electrode 41c. The covering part 41d covers the capacitor body 41a, part of the first electrode 41b, and part of the second electrode 41c.

One end of the conducting member 28a is fixed to the second electrode 41c. To fix the conducting member 28a to the second electrode 41c, a bolt 28d penetrating through the conducting member 28a is screwed into a bolt hole 41f formed at the second electrode 41c. The other end of the conducting member 28a is fixed to the connection plate 20b.

Accordingly, the second electrode 41c of the preionization capacitor C11 is electrically connected with the output terminal for the pulse high voltage output from the pulse power module 13, through the conducting member 28a.

The first electrode 41b is connected with a cooling structure including a preionization wire 35b, an insulating part 43, and a cooling part 44. The preionization wire 35b corresponds to a conducting part in the present disclosure.

The preionization wire 35b includes a male screw part 35g. When the male screw part 35g is screwed into a bolt hole 41e of the first electrode 41b, the preionization wire 35b and the first electrode 41b are electrically connected with each other. The preionization wire 35b is made of a material such as copper having high electric conductivity.

The preionization wire 35b is introduced into the laser chamber 10 through the feed through 36. The preionization wire 35b is electrically connected with the preionization inner electrode 25 inside the laser chamber 10. Accordingly, the first electrode 41b is electrically connected with the preionization inner electrode 25. The preionization inner electrode 25 has a potential between the potential of the pulse high voltage output from the pulse power module 13 and the reference potential.

The preionization wire 35b has a through-hole 35f between the position of the male screw part 35g and the position of the feed through 36.

The insulating part 43 has a first surface including a first position 43a, and a second surface including a second position 43b. The first surface and the second surface are opposite to each other. The first position 43a and the second position 43b face to each other. The insulating part 43 also includes first covers 43c and 43d protruding substantially in the normal direction of the first surface near the first position 43a as illustrated in FIG. 5C. The insulating part 43 also includes second covers 43e and 43f protruding substantially in the normal direction of the second surface near the second position 43b as illustrated in FIG. 5B.

The insulating part 43 is preferably made of a material having low relative permittivity. The relative permittivity of the insulating part 43 is preferably 10 or lower. For example, the insulating part 43 is made of aluminum oxide having a relative permittivity of 8.4 to 9.9 inclusive, or aluminum nitride having a relative permittivity of 8.5 to 8.6 inclusive.

A first fastening part 47 is fixed to the first position 43a of the insulating part 43. The first fastening part 47 includes a fifth part 47a positioned on one side of the through-hole 35f in the penetration direction, and a sixth part 47b positioned on the other side of the through-hole 35f in the penetration direction. The fifth part 47a is brazed at the first position 43a. The fifth part 47a and the sixth part 47b are configured by a single bolt.

The first fastening part 47 further includes a nut 47c. When attached to the sixth part 47b and rotated, the nut 47c moves along a screw groove of the sixth part 47b in a direction approaching the fifth part 47a. Accordingly, the preionization wire 35b and the insulating part 43 are fastened to each other. In this case, the preionization wire 35b is fixed in close contact with the first position 43a of the insulating part 43. The first covers 43c and 43d sandwich two side surfaces of the preionization wire 35b, covering part of the preionization wire 35b. The nut 47c corresponds to a seventh part in the present disclosure.

When the insulating part 43 is made of ceramic containing aluminum oxide, the first fastening part 47 preferably contains an alloy containing nickel and cobalt. Accordingly, the insulating part 43 and the first fastening part 47 are made of materials having thermal expansion rates close to each other, thereby preventing the fixation between the insulating part 43 and the first fastening part 47 by brazing from being affected by temperature change.

For sufficiently close contact between the preionization wire 35b and the insulating part 43, a contact surface of the preionization wire 35b and the insulating part 43 preferably has a surface roughness Ra of 6.3 μm or smaller. For example, the surface roughness Ra is preferably 3.2 μm. In addition, the contact surface of the preionization wire 35b and the insulating part 43 preferably has area of 110 mm² or larger. For example, the area is preferably 150 mm².

The preionization wire 35b and the first position 43a of the insulating part 43 may contact each other through a metal sheet. Alternatively, the preionization wire 35b and the first position 43a of the insulating part 43 may contact each other through a resin sheet. The material and thickness of the metal sheet or the resin sheet may be same as those described in the first embodiment. When the metal sheet or the resin sheet is used, a space layer between the preionization wire 35b and the insulating part 43 is reduced so that heat conduction from the preionization wire 35b to the insulating part 43 is efficiently performed.

The cooling part 44 has a bolt hole 44a. When a bolt 46 penetrating through the insulating part 43 is screwed into the bolt hole 44a, the cooling part 44 and the insulating part 43 are fastened to each other.

In this case, the cooling part 44 is fixed in close contact with the second position 43b of the insulating part 43. The second covers 43e and 43f sandwich two side surfaces of the cooling part 44, covering part of the cooling part 44.

The cooling part 44 is connected with the cooling mechanism 27f at a part different from a part fastened to the insulating part 43. Accordingly, heat conduction from the cooling part 44 to the cooling mechanism 27f is possible. The cooling part 44 is electrically connected with the reference potential through the cooling mechanism 27f and the connection plate 10f.

For sufficiently close contact between the cooling part 44 and the insulating part 43, a contact surface of the cooling part 44 and the insulating part 43 preferably has a surface roughness Ra of 6.3 μm or smaller. For example, the surface roughness Ra is preferably 3.2 μm. In addition, the contact surface of the cooling part 44 and the insulating part 43 preferably has area of 110 mm² or larger. For example, the area is preferably 150 mm².

The cooling part 44 and the second position 43b of the insulating part 43 may contact each other through a metal sheet. Alternatively, the cooling part 44 and the second position 43b of the insulating part 43 may contact each other through a resin sheet. The material and thickness of the metal sheet or the resin sheet may be same as those described in the first embodiment. When the metal sheet or the resin sheet is used, a space layer between the cooling part 44 and the insulating part 43 is reduced so that heat conduction from the insulating part 43 to the cooling part 44 is efficiently performed.

3.2 Operation and Effect

Heat generated at the preionization capacitor C11 is discharged to the cooling part 44 by heat conduction through the preionization wire 35b and the insulating part 43. Since the preionization wire 35b is fixed in close contact with the first position 43a of the insulating part 43 by the first fastening part 47, heat conduction from the preionization wire 35b to the insulating part 43 is efficiently performed. Since the cooling part 44 is fixed in close contact with the second position 43b of the insulating part 43 by the bolt 46, heat conduction from the insulating part 43 to the cooling part 44 is efficiently performed.

The first position 43a and the second position 43b are positioned facing each other. With this configuration, heat discharge from the preionization wire 35b to the cooling part 44 is efficiently performed when the thermal conductivity of the insulating part 43 is lower than the thermal conductivity of the preionization wire 35b or the cooling part 44.

The preionization wire 35b is electrically connected with the preionization inner electrode 25 at a potential that allows corona discharging for preionization of part of the laser gas, and the cooling part 44 is electrically connected with the reference potential. However, the preionization wire 35b is electrically insulated from the cooling part 44 by the insulating part 43. With this configuration, the preionization wire 35b can be cooled by using the cooling part 44 when the potential of the preionization wire 35b and the potential of the cooling part 44 are different from each other.

The first covers 43c and 43d of the insulating part 43 cover part of the preionization wire 35b, and the second covers 43e and 43f of the insulating part 43 cover part of the cooling part 44. Accordingly, electrical discharging between the preionization wire 35b and the cooling part 44 can be prevented.

The insulating part 43 is made of a material having low relative permittivity. Accordingly, the capacitance of the insulating part 43 is reduced so that the insulating part 43 can be prevented from functioning as a capacitor.

Other features are same as those of the first embodiment described with reference to FIGS. 4A and 4B.

In the above description, the cooling part 44 and the insulating part 43 are fastened to each other by the bolt 46, but the present disclosure is not limited thereto. Similarly to the fastening of the preionization wire 35b and the insulating part 43, the cooling part 44 and the insulating part 43 may be fastened to each other by a fastening part (not illustrated) brazed at the second position 43b of the insulating part 43 and penetrating through a through-hole of the cooling part 44.

4. Other

4.1 Configuration of Reference Example

Figure 6A:
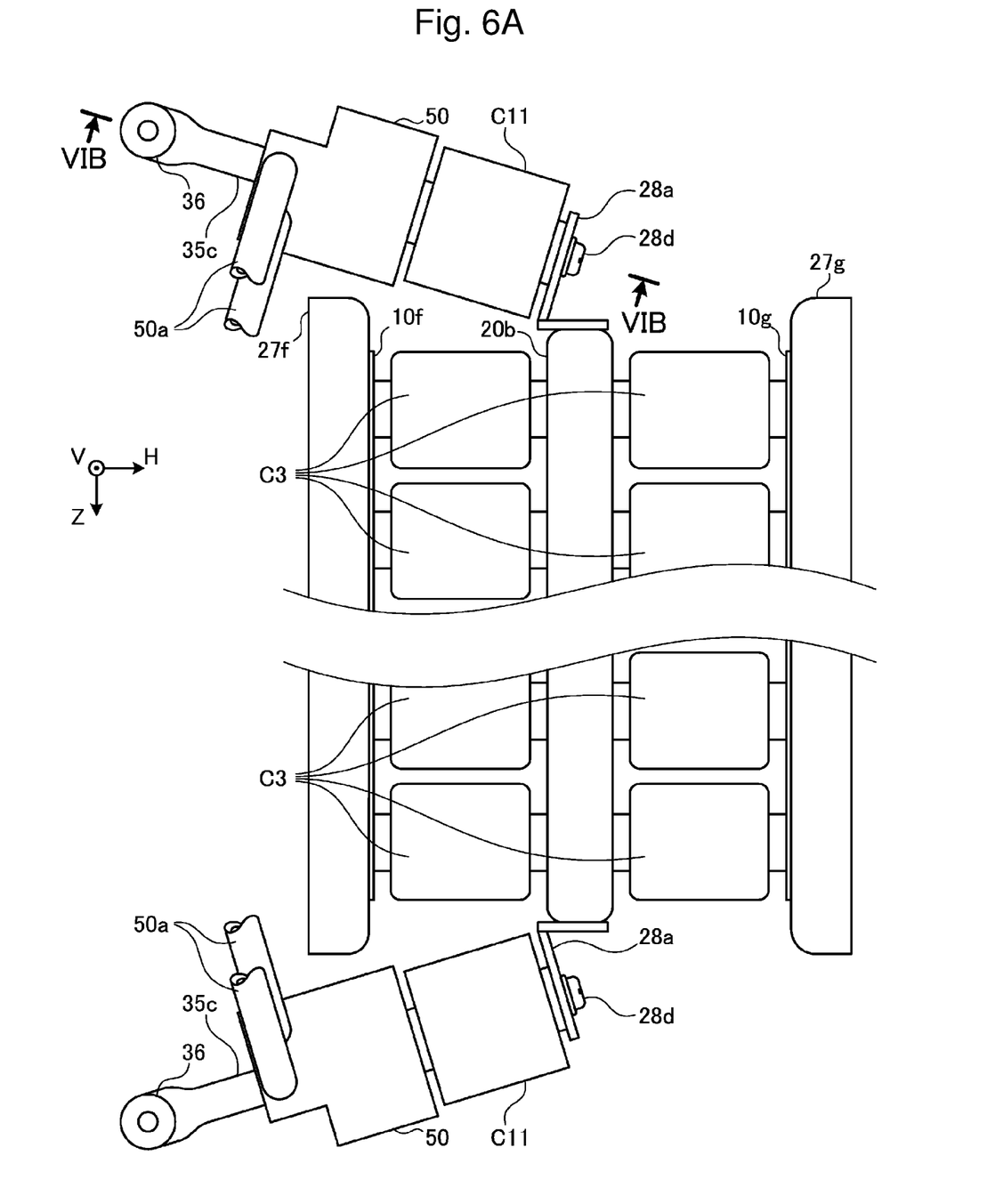
FIG. 6A is a plan view illustrating disposition of peaking capacitors and preionization capacitors in a laser apparatus according to a reference example.
Figure 6B:
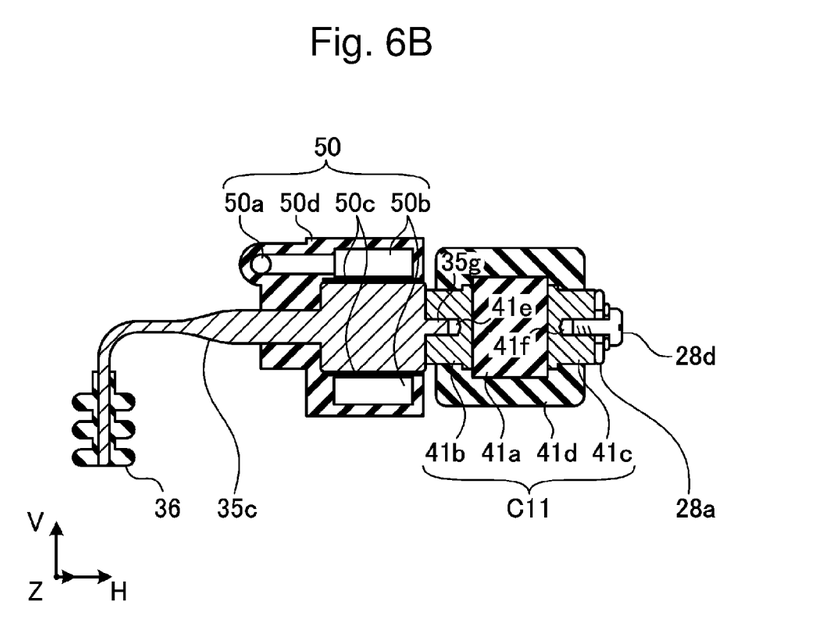
FIG. 6B is a cross-sectional view taken along line VIB-VIB in FIG. 6A.

FIG. 6A is a plan view illustrating disposition of peaking capacitors and preionization capacitors in a laser apparatus according to a reference example. FIG. 6B is a cross-sectional view taken along line VIB-VIB in FIG. 6A.

In the reference example, the first electrode 41b illustrated in FIG. 6B is connected with a cooling structure including a preionization wire 35c and a cooling device 50. The preionization wire 35c is electrically connected with the preionization inner electrode 25 inside the laser chamber 10. The preionization inner electrode 25 has a potential between the potential of the pulse high voltage output from the pulse power module 13 and the reference potential.

The cooling device 50 includes a supply discharge part 50a, a cooling pipe part 50b, an insulation sheet 50c, and a covering part 50d. The supply discharge part 50a and the cooling pipe part 50b are electrically connected with, for example, the reference potential.

The supply discharge part 50a is a pipe connected with, for example, a pump (not illustrated). The supply discharge part 50a supplies a cooling medium such as water to the cooling pipe part 50b, and discharges the cooling medium having passed through the cooling pipe part 50b.

The cooling pipe part 50b is a pipe disposed around the preionization wire 35c and made of a material having high thermal conductivity. The cooling pipe part 50b causes the cooling medium supplied from the supply discharge part 50a to pass therethrough. In this case, heat conduction is performed from the preionization wire 35c to the cooling medium. The cooling medium having passed through the cooling pipe part 50b is discharged through the supply discharge part 50a.

The insulation sheet 50c is disposed between the preionization wire 35c and the cooling pipe part 50b. The insulation sheet 50c is desirably made of a material ensuring electrical insulation and having high thermal conductivity.

The covering part 50d is made of insulating resin and covers part of the supply discharge part 50a and the cooling pipe part 50b. The covering part 50d prevents electrical discharging between each of the supply discharge part 50a and the cooling pipe part 50b and the preionization wire 35c.

4.2 Operation and Effect of the Reference Example

Heat generated at the preionization capacitor C11 is discharged to the cooling pipe part 50b by heat conduction through the preionization wire 35c and the insulation sheet 50c and is also discharged to the supply discharge part 50a through the cooling medium. When the insulation sheet 50c having high thermal conductivity is employed, heat conduction from the preionization wire 35c to the cooling pipe part 50b is efficiently performed.

The preionization wire 35c is electrically connected with the preionization inner electrode 25 at a potential that allows corona discharging for preionization of part of the laser gas, and the supply discharge part 50a and the cooling pipe part 50b are electrically connected with the reference potential. However, the preionization wire 35c is electrically insulated from the supply discharge part 50a and the cooling pipe part 50b by the insulation sheet 50c and the covering part 50d. With this configuration, the preionization wire 35c can be cooled by using the cooling device 50 when the potential of the preionization wire 35c and the potential of each of the supply discharge part 50a and the cooling pipe part 50b are different from each other.

Other features are same as those of the second embodiment described with reference to FIGS. 5A to 5C.

4.3 Supplement

In the first embodiment, the first electrode 31b electrically connected with the output terminal of the pulse power module 13 is cooled. In the second embodiment and the reference example, the first electrode 41b electrically connected with the preionization inner electrode 25 is cooled. However, the present disclosure is not limited thereto. The electrode electrically connected with the output terminal of the pulse power module 13, and the electrode electrically connected with the preionization inner electrode 25 may be both cooled. Optional two of the cooling structures according to the first embodiment, the second embodiment, and the reference example may be combined.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more."

What is claimed is:

1. A capacitor cooling structure for a capacitor including a first electrode and a second electrode, the capacitor cooling structure comprising:
    a conducting part electrically connected with the first electrode;
    an insulating part that has a first surface including a first position and a second surface including a second position, and is connected with the conducting part at the first position;
    a first fastening part configured to fasten the conducting part and the insulating part; and
    a cooling part connected with the second position facing the first position,
    the conducting part and the cooling part being electrically insulated from each other by the insulating part.

2. The capacitor cooling structure according to claim 1, wherein the conducting part and the insulating part contact each other through a metal sheet.

3. The capacitor cooling structure according to claim 1, wherein the conducting part and the insulating part contact each other through a resin sheet.

4. The capacitor cooling structure according to claim 1, wherein the insulating part covers one end of the conducting part.

5. The capacitor cooling structure according to claim 1, wherein the insulating part covers one end of the cooling part.

6. The capacitor cooling structure according to claim 1, wherein
    the insulating part contains aluminum oxide, and
    the first fastening part contains an alloy containing nickel and cobalt.

7. The capacitor cooling structure according to claim 1, wherein part of the first fastening part is brazed to the insulating part.

8. The capacitor cooling structure according to claim 1, wherein
the conducting part has a first bolt hole at which a female screw is formed, and
the first fastening part includes a first part brazed to the insulating part and a second part at which a male screw to be screwed into the first bolt hole is formed.

9. The capacitor cooling structure according to claim 8, wherein the first bolt hole includes a first large-diameter part in which the first part is housed and a first small-diameter part in which the second part is housed.

10. The capacitor cooling structure according to claim 1, further comprising a second fastening part configured to fasten the cooling part and the insulating part.

11. The capacitor cooling structure according to claim 10, wherein
the insulating part contains aluminum oxide, and
the second fastening part contains an alloy containing nickel and cobalt.

12. The capacitor cooling structure according to claim 10, wherein part of the second fastening part is brazed to the insulating part.

13. The capacitor cooling structure according to claim 10, wherein
the cooling part has a second bolt hole at which a female screw is formed, and
the second fastening part includes a third part brazed to the insulating part and a fourth part at which a male screw to be screwed into the second bolt hole is formed.

14. The capacitor cooling structure according to claim 13, wherein the second bolt hole includes a second large-diameter part in which the third part is housed and a second small-diameter part in which the fourth part is housed.

15. The capacitor cooling structure according to claim 1, wherein the first electrode is electrically connected with an output terminal of a power source device, and the second electrode is electrically connected with a third electrode having a potential between the potential of the output terminal and a reference potential.

16. The capacitor cooling structure according to claim 15, wherein the cooling part is electrically connected with the reference potential.

17. The capacitor cooling structure according to claim 1, wherein
the conducting part has a through-hole, and
the first fastening part includes a fifth part brazed to the insulating part and positioned on one side of the through-hole in a penetration direction, a sixth part positioned on the other side of the through-hole in the penetration direction, and a seventh part attached to the sixth part and configured to fix the conducting part to the insulating part.

18. The capacitor cooling structure according to claim 1, wherein the second electrode is electrically connected with an output terminal of a power source device, and the first electrode is electrically connected with a third electrode having a potential between the potential of the output terminal and a reference potential.

19. The capacitor cooling structure according to claim 18, wherein the cooling part is electrically connected with the reference potential.

20. A laser apparatus comprising:
a laser chamber;
a pair of discharge electrodes disposed in the laser chamber;
a pulse power module including a peaking capacitor and configured to apply pulse voltage between the discharge electrodes;
a preionization mechanism including a preionization capacitor and configured to ionize part of gas inside the laser chamber, the preionization capacitor including a first electrode and a second electrode;
a conducting part electrically connected with the first electrode;
an insulating part that has a first surface including a first position and a second surface including a second position, and is connected with the conducting part at the first position;
a first fastening part configured to fasten the conducting part and the insulating part to each other; and
a cooling part connected with the second position facing the first position,
the conducting part and the cooling part being electrically insulated from each other by the insulating part.

* * * * *